United States Patent
Lee et al.

(10) Patent No.: US 9,505,903 B2
(45) Date of Patent: Nov. 29, 2016

(54) RESIN COMPOSITION FOR EMI SHIELDING, COMPRISING CARBON HYDRIDE COMPOSITE

(71) Applicant: HANWHA CHEMICAL CORPORATION, Seoul (KR)

(72) Inventors: Jin Seo Lee, Daejeon (KR); Man Woo Jung, Daejeon (KR); Seung hoe Do, Daejeon (KR); Seong Yun Jeon, Daejeon (KR); Jae Yun Lim, Incheon (KR)

(73) Assignee: HANWHA CHEMICAL CORPORATION, Seoul (KR)

( * ) Notice: Subject to any disclaimer, the term of this patent is extended or adjusted under 35 U.S.C. 154(b) by 21 days.

(21) Appl. No.: 14/371,807

(22) PCT Filed: Jan. 4, 2013

(86) PCT No.: PCT/KR2013/000055
§ 371 (c)(1),
(2) Date: Jul. 11, 2014

(87) PCT Pub. No.: WO2013/105757
PCT Pub. Date: Jul. 18, 2013

(65) Prior Publication Data
US 2015/0005411 A1    Jan. 1, 2015

(30) Foreign Application Priority Data

Jan. 12, 2012  (KR) .................. 10-2012-0003846

(51) Int. Cl.
*G21F 1/10*    (2006.01)
*G21K 1/10*    (2006.01)
(Continued)

(52) U.S. Cl.
CPC ................. *C08K 3/22* (2013.01); *C08J 5/005* (2013.01); *C08K 3/04* (2013.01); *H05K 9/009* (2013.01);
(Continued)

(58) Field of Classification Search
CPC .... C08K 3/22; C08K 3/04; C08K 2003/045; H05K 9/009; H05K 9/0083; C08J 5/005; C08J 2300/22; C08J 2323/12; Y10S 977/752
USPC ......................................................... 523/137
See application file for complete search history.

(56) References Cited

U.S. PATENT DOCUMENTS 7,861,559 B2    1/2011    Lonati et al.
2006/0116443 A1    6/2006    Probst et al.
(Continued)

FOREIGN PATENT DOCUMENTS

JP    2002-97375    4/2002
JP    2003-505332    2/2003
(Continued)

OTHER PUBLICATIONS

International Search Report for corresponding PCT application No. PCT/KR2013/000055, Apr. 30, 2013.

*Primary Examiner* — David Karst
(74) *Attorney, Agent, or Firm* — Hauptman Ham, LLP

(57) ABSTRACT

Provided is a resin composition for electromagnetic interference shielding. More particularly, provided is a resin composition having superior dispersibility and impact relaxation and high conductivity, the resin comprising: (a) 100 parts by weight of a resin; based on 100 parts by weight of the resin, (b) 0.1 to 15 parts by weight of a carbon nanotube surface-modified in a condition of the absence of oxidant; and (c) 1 to 40 parts by weight of a carbon compound, a metal, a metal compound, or a mixture thereof. The resin composition for electromagnetic interference shielding, comprising a carbon hydride composite, is specifically useful in an electronic control unit material for weight reduction of car, and thus can be replaced with a high-priced heavy metal material.

9 Claims, 1 Drawing Sheet

(51) Int. Cl.
 *C08K 3/22* (2006.01)
 *C08K 3/04* (2006.01)
 *H05K 9/00* (2006.01)
 *C08J 5/00* (2006.01)

(52) U.S. Cl.
 CPC .......... *H05K 9/0083* (2013.01); *C08J 2300/22* (2013.01); *C08J 2323/12* (2013.01); *C08K 2003/045* (2013.01); *Y10S 977/752* (2013.01)

(56) References Cited

U.S. PATENT DOCUMENTS

2010/0056819 A1   3/2010   Jang et al.

2010/0080978 A1*  4/2010   Jerome ................ C08J 9/0066
                                                       428/317.9

FOREIGN PATENT DOCUMENTS

| JP | 2010-27512 | 2/2010 | | |
|----|----|----|----|----|
| JP | 2010-513653 | 4/2010 | | |
| KR | 1020060039277 | 8/2006 | | |
| KR | 100873870 | 12/2008 | | |
| KR | 102010086854 | 2/2010 | | |
| KR | 1020100058342 | 6/2010 | | |
| KR | WO 2011002222 A2 * | 1/2011 | ............ | B82Y 30/00 |
| KR | 101021805 | 3/2011 | | |
| TW | 201035996 A1 | 10/2010 | | |
| TW | 201105576 A1 | 2/2011 | | |
| WO | 2010059008 A2 | 5/2010 | | |

* cited by examiner

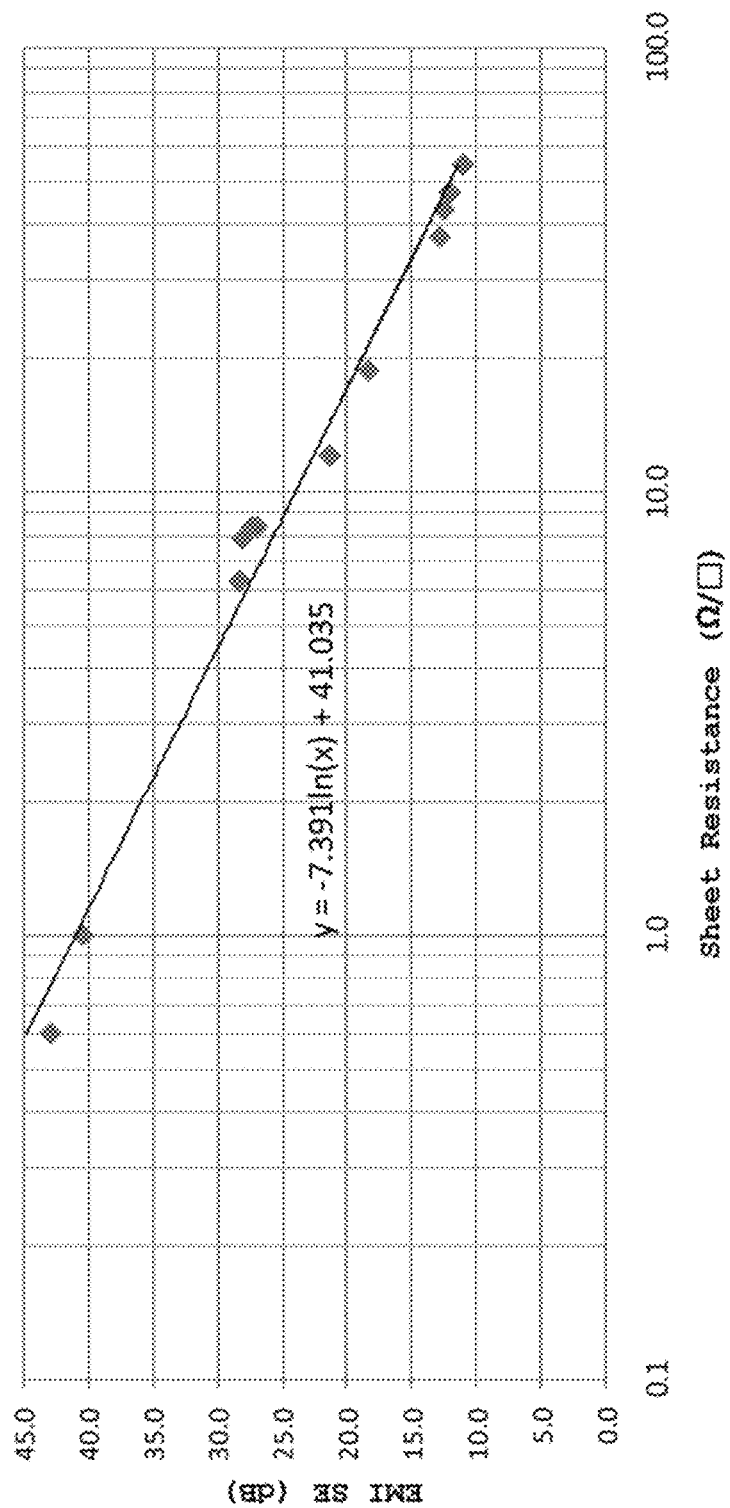

RESIN COMPOSITION FOR EMI SHIELDING, COMPRISING CARBON HYDRIDE COMPOSITE

TECHNICAL FIELD

The following disclosure relates to a resin composition for electromagnetic interference (EMI) shielding, comprising a carbon hydride composite. More particularly, the following disclosure relates to a high-conductive resin composition for EMI shielding, having excellent dispersibility and impact relaxation, and containing: (a) 100 parts by weight of a resin; based on 100 parts by weight of the resin, (b) 0.1 to 15 parts by weight of carbon nanotubes surface-modified in the subcritical water or supercritical water condition not using a separate oxidant (hereinafter, a condition of the absence of oxidant); and (c) 1 to 40 parts by weight of a carbon compound, metal, a metal compound, or a mixture thereof. The resin composition for EMI shielding, comprising a carbon hydride composite, according to the present invention, is specifically useful in an electronic control unit material for weight reduction of a car, and thus can be replaced with a high-priced heavy metal material.

BACKGROUND ART

Miniaturization and integration of electronic devices have caused the flood of electromagnetic waves even at work and home together with rapid supply of PC, mobile phones, and digital devices, and thus electronic industries have been developed but the threat of electromagnetic interference has been more growing.

The electromagnetic interference variously appears ranging from false operations of computers to burnout accidents of factories, and further, research results about adverse effects of the electromagnetic interference on human bodies are represented one after another, so that concerns and interests for health have increased. In this situation, restrictions on the electromagnetic interference have been strengthened and measures therefor have been prepared.

Since an EMI shielding effect is directly proportional to electroconductivity, metals are generally used currently as most EMI shielding materials.

Metal materials reflect electromagnetic waves, but insulating materials such as plastics and the like allow electromagnetic waves to pass therethrough. EMI shielding has been widely known. When electromagnetic waves reach an electrical conductor, some of them are absorbed to and passed through the metal but most of them reflect from a surface of the metal, without entering the metal. The reason is that, when the electromagnetic waves reach the conductor, eddy current is generated in the conductor due to electromagnetic induction, which reflects the electromagnetic waves.

Many attempts have been made to impart electroconductivity to a resin composition, which is then used to allow vehicles and various kinds of electric apparatuses, electronic assemblies, or cables to exhibit EMI shielding performance or the like.

This electroconductive resin composition is prepared by generally mixing a conductive additive, such as, carbon black, carbon fiber, metal powder, metal coated inorganic powder, or metal fiber, to a polymer. However, it is difficult to secure a sufficiently desired degree of electroconductivity of the electroconductive resin composition so long as a considerable amount of the conductive additive is not added.

In addition, in the case of a polymer composite using carbon materials such as carbon black, carbon fiber, or the like, a large amount of inorganic material is input, resulting in higher hardness, surface roughness, and deterioration in physical properties, of the resin, and thus it is difficult to realize high conductivity required.

Meanwhile, attempts to impart excellent electroconductivity to the electroconductive polymer by using a carbon nanotube as a conductive additive was made.

However, in the case where an electroconductive composite is obtained by mixing the carbon nanotube to the polymer and performing extrusion-ejection, the carbon nanotubes are agglomerated or aligned due to shear stress generated during the extrusion-ejection process and the carbon nanotubes are defectively dispersed in the electroconductive polymer, and thus it is difficult to obtain a sufficiently desired degree of electroconductivity.

As described above, the related art has problems of deterioration in dispersibility, excessive amounts of additives used, and not meeting the desired degrees of physical properties.

Korean Patent Laid-Open Publication No. 2011-0000296 discloses "a fabrication method of polymer/carbon nanotube composite and a polymer/carbon nanotube composite manufactured by the method, the polymer/carbon nanotube composite having good electromagnetic interference shielding efficiency, the method comprising: a) dissolving a first polymer resin and a carbon nanotube (weight ratio of 100:5 to 100:30) in a solvent and performing ultrasonication, to prepare a preliminary composite; and b) mixing the preliminary composite and a second polymer resin (weight ratio of 1:1 to 1:15) in an extruder".

In addition, Korean Patent Laid-Open Publication No. 2011-0104456 discloses "an electroconductive resin composition for being used as a molding material of information technology devices requiring an electric wave transmission and reception function, the electroconductive resin composition comprising: a) 30~60 wt % of a polymer resin; b) 3~15 wt % of carbon black and 2~10 wt % of a carbon nanotube, as a conductive material; and c) 30~55 wt % of a carbon fiber for electrically connecting between the conductive carbon black and the carbon nanotube".

However, according to the technologies disclosed in these patent documents, it is still difficult to disperse the carbon nanotube in the resin in order to maximally exhibit performance of the carbon nanotube, and a large amount of carbon nanotube needs to be input to exhibit EMI shielding effect, and thus high-priced raw materials are more used as compared with the existing carbon materials such as carbon black or carbon fiber, resulting in low economic feasibility.

DISCLOSURE

Technical Problem

An embodiment of the present invention is directed to providing a resin composition for EMI shielding, comprising a carbon hydride composite exhibiting enhanced physical properties and an excellent EMI shielding effect, by using a carbon nanotube (CNT) surface-modified in a condition of the absence of oxidant condition to thereby improve dispersibility and improve miscibility of the carbon nanotube surface-modified in a condition of the absence of oxidant, a carbon compound, metal, a metal compound, or a mixture thereof, and a molded article manufactured by using the same.

Technical Solution

In one general aspect, there is provided a resin composition for electromagnetic interference (EMI) shielding, the resin composition comprising: (a) 100 parts by weight of a resin; based on 100 parts by weight of the resin, (b) 0.1 to 15 parts by weight of a carbon nanotube surface-modified in a condition of the absence of oxidant; and (c) 1 to 40 parts by weight of a carbon compound, a metal, a metal compound, or a mixture thereof.

In the resin composition for EMI shielding according to the present invention, the resin may be one resin, a copolymer resin of two or more, or a mixture of two or more, selected from the group consisting of a polyacetal resin, an acryl based resin, a polycarbonate resin, a styrene based resin, a polyester resin, a vinyl based resin, a polyphenylene ether resin, a polyolefin resin, an acrylonitrile-butadiene-styrene copolymer resin, a polyarylate resin, a polyamide resin, a polyamideimide resin, a polyarylsulfone resin, a polyetherimide resin, a polyethersulfone resin, a polyphenylene sulfide resin, a fluorine based resin, a polyimide resin, a polyether ketone resin, a polybenzoxazole resin, a polyoxadiazol resin, a polybenzothiazole resin, a polybenzimidazole resin, a polypyridine resin, a polytriazole resin, a polypyrrolidone resin, a polydibenzofuran resin, a polysulfone resin, a polyurea resin, a polyphosphazene resin, a liquid crystal polymer resin, a silicon based resin, an epoxy resin, a phenol based resin, and a polyurethane resin. The polyolefin resin is preferable, and, above all, polypropylene is more preferable.

In the resin composition for EMI shielding according to the present invention, the carbon nanotube (CNT) surface-modified in a condition of the absence of oxidant may be obtained by surface-treating a carbon nanotube with only dissolved oxygen that is dissolved in water in a subcritical water or supercritical water condition of a pressure of 50 to 400 atm and a temperature of 100 to 600° C. without using the existing oxidant such as oxygen, air, ozone, oxygenated water, or the like. A carbon nanotube that is not harmful in the subcritical or supercritical condition and is environmentally friendly surface-modified due to the non-use of an oxidant for facilitating handling and wastewater treatment may be obtained, and the carbon nanotube bundle is downsized to thereby improve dispersibility. The surface modification in a condition of the absence of oxidant of the subcritical water or supercritical water condition prevents the carbon nanotube from being burned due to the use of the oxidant, thereby allowing the process yield to reach 100%.

In addition, the carbon nanotube may be preferably selected from the group consisting of a single-walled carbon nanotube, a double-walled carbon nanotube, a thin multi-walled carbon nanotube, a multi-walled carbon nanotube, a roped carbon nanotube, and a combination thereof.

In addition, in the present invention, 0.1~15 parts by weight of the carbon nanotube surface-modified in a condition of the absence of oxidant may be used based on 100 parts by weight of the resin. The carbon nanotube surface-modified in a condition of the absence of oxidant of the present invention may improve mechanical properties and the balance of electroconductivity. If the carbon nanotube surface-modified in a condition of the absence of oxidant is used in a content below 0.1 part by weight, electroconductivity may be decreased, failing to exhibit the EMI shielding effect. If above 15 parts by weight, uniform dispersion in the resin may not be obtained, resulting in deteriorating processability.

In the resin composition for EMI shielding according to the present invention, the carbon compound, metal, metal compound, or mixture thereof may be included in a content of 1 to 40 parts by weight based on 100 parts by weight of the resin. If the carbon compound, metal, metal compound, or mixture thereof is below 1 part by weight, electroconductivity may be decreased, failing to exhibit the EMI shielding effect. If above 40 parts by weight, uniform dispersion in the resin may not be obtained, resulting in deteriorating processability.

The carbon compound is preferably selected from the group consisting of carbon black, graphene, fullerene, graphite, graphite oxide, carbon fiber, and a mixture thereof, and the metal or metal compound is preferably selected from the group consisting of copper, iron, nickel, aluminum, tin, zinc, silver, gold, nickel-copper alloy, alumina ($Al_2O_3$), alumina nitride (AlN), and an oxide thereof. In addition, the carbon compound, metal, or metal compound has an average particle size of preferably 0.001~300 µm; the carbon black of the carbon compound has an average particle size of preferably 0.01~0.5 µm; and the graphite has a powder type and has an average particle size of preferably 1~300 µm. Also, the carbon fiber is preferably a fine fiber having an average particle size of 0.01~10 µm. Preferably, the alumina is in a powder type, and has an average particle size of 0.1~50 µm. The carbon compound may be surface-modified in a condition of the absence of oxidant under a subcritical water or supercritical water condition of a pressure of 50 to 400 atm and a temperature of 100 to 600° C.

The weight ratio of the carbon nanotube (CNT) surface-modified in a condition of the absence of oxidant and the carbon compound, metal, metal compound, or mixture thereof may be preferably 1:0.01 to 100 to thereby effectively improve miscibility, but the present invention is not limited to this numerical range.

A molded article may be manufactured by mixing the resin composition for EMI shielding of the present invention and using the previously known method. The mixing of these respective components may be formed into a pellet by a conventional extruding process, and the thus formed pellet may be manufactured into a molded article such as a sheet, a film, a structure, or the like, through extrusion molding, ejection molding, heat molding, or the like, according to the use thereof.

In addition, the molded article is a plastic molded article capable of allowing thermal conductivity, electrostatic dispersion, or prevention of static electricity, by controlling the EMI shielding effect, and more preferably an electronic control unit material for weight reduction of a car, and thus can be replaced with a high-priced heavy metal material.

Advantageous Effects

As set forth above, the resin composition for EMI shielding, comprising a carbon hydride composite of the present invention employs the carbon nanotube surface-modified in a condition of the absence of oxidant; and the carbon compound, metal, metal compound, or a mixture thereof, as a composite material, and thus has excellent dispersibility and impact relaxation and high conductivity, and particularly has an EMI shielding effect.

In addition, the resin composition for EMI shielding of the present invention employs the carbon nanotube surface-modified in a condition of the absence of oxidant, and thus can facilitate surface modification in the environmentally friendly condition due to the exclusion of the use of acid and improve dispersibility with the resin.

The resin composition for EMI shielding, comprising a carbon hydride composite, according to the present invention, is specifically useful in an electronic control unit material for weight reduction of car, and thus can be replaced with a high-priced heavy metal material.

DESCRIPTION OF DRAWINGS

FIG. 1 is a graph showing an electromagnetic interference (EMI) fielding effect in a preferable embodiment of the present invention.

MODE FOR INVENTION

The present invention will be described in detail with reference to the following examples.

Preparative Example 1

Preparation of Multi-Walled Carbon NanoTube Surface-Modified in Non-Oxidant Condition 21 g of multi-walled carbon nanotube (hereafter, MWCNT, average particle size: 0.01 μm) was mixed with 979 g of distilled water by a circulating pump, to prepare an MWCNT solution in a pre-treating bath. The MWCNT solution was input to a pre-heating bath, which has been preheated to 150 to 200° C. by a heat exchanger, at a flow rate of 30 g/min through a high-pressure injection pump. The preheated solution was injected into a surface modification reactor in a condition of the absence of oxidant under a subcritical water state of 200° C. and 230 atm to 250 atm, and surface-modified. The product surface-modified in a condition of the absence of oxidant was again conveyed to the heat exchanger to be firstly cooled to 150° C., again cooled to 25° C. by a cooling unit, and then 20.9 g of multi-walled carbon nanotube continuously surface-modified in a condition of the absence of oxidant was obtained. The obtained multi-walled carbon nanotube becomes de-agglomerated in the supercritical water, to thereby improve dispersibility thereof, and has less carbon nanotube defects due to a low oxygen content (0.1 wt %), to thereby exhibit high inherent electroconductivity and an EMI shielding effect.

Preparative Example 2

Preparation of Multi-Wall Carbon NanoTube Surface-Modified in Oxygen Oxidant Condition A multi-walled carbon nanotube surface-modified by the same method as Preparative Example 1, except that oxygen was used as an oxidant, was obtained. A gas phase of oxygen compressed to 245 atm to 252 atm was mixed with an MWCNT solution at a flow rate of 0.8 g/min at a front end of a heat exchanger, and was input to a pre-heating bath, which has been preheated to 150 to 200° C. The obtained multi-walled carbon nanotube becomes de-agglomerated in the supercritical water, to thereby improve dispersibility thereof, but is oxidized due to a high oxygen content (5.2 wt %), resulting in many carbon nanotube defects, thereby decreasing high inherent electroconductivity and deteriorating the EMI shielding performance.

Preparative Example 3

Preparation of Carbon Black Surface-Modified in Condition of Absence of Oxidant

Carbon black surface-modified in a condition of the absence of oxidant by the same method as Preparative Example 1, except that carbon black was used instead of MWCNT, was obtained.

Example 1

855 g of polypropylene, 25 g of carbon nanotube (MWCNT) surface-modified in a condition of the absence of oxidant of Preparative Example 1, and 120 g of carbon black (average particle size: 0.02 μm) were input to a hopper of a rotating twin screw extruder. A polymer resin was melted in a barrel by rotation of a shaft of the extruder at 200° C., kneaded with a carbon material, and then continuously extruded through a die of the extruder. A polypropylene strand extruded from the extruder was formed into a conventional short pellet by using a pelletizer.

Example 2

The same as Example 1 was carried out except that 50 g of MWCNT of Preparative Example 1, 800 g of polypropylene, and 150 g of carbon black (average particle size: 0.02 μm) were used as different contents of components.

Example 3

The same as Example 1 was carried out except that 120 g of carbon fiber (average particle size: 7 μm) instead of carbon black was used.

Example 4

The same as Example 1 was carried out, except that 70 g of MWCNT of Preparative Example 1, 680 g of polypropylene, and 250 g of carbon black (average particle size: 0.02 μm) were used as different contents of components.

Example 5

The same as Example 1 was carried out, except that 250 g of aluminum oxide ($Al_2O_3$, average particle size: 10 μm) instead of carbon black was used and 70 g of MWCNT of Preparative Example 1 and 680 g of polypropylene were used as different contents thereof.

Example 6

The same as Example 1 was carried out, except that the carbon black surface-treated in a condition of the absence of oxidant of Preparative Example 3 was used instead of the carbon black not surface-treated of Example 1.

Comparative Example 1

The same as Example 1 was carried out, except that 25 g of the MWCNT surface-modified with oxygen of Preparative Example 2 was used instead of the MWCNT of Preparative Example 1.

Comparative Example 2

The same as Example 2 was carried out, except that 50 g of the MWCNT surface-modified with oxygen of Preparative Example 2 was used instead of the MWCNT of Preparative Example 1.

Comparative Example 3

The same as Example 3 was carried out, except that 25 g of the MWCNT surface-modified with oxygen of Preparative Example 2 was used instead of the MWCNT of Preparative Example 1.

Comparative Example 4

The same as Example 1 was carried out while 800 g of polypropylene and 200 g of carbon black (average particle size: 0.02 μm) were used without using the MWCNT of Preparative Example 1.

Comparative Example 5

The same as Example 1 was carried out while 800 g of polypropylene and 200 g of carbon fiber (average particle size: 7 μm) were used without using the MWCNT of Preparative Example 1.

Comparative Example 6

The same as Example 1 was carried out while 100 g of the MWCNT of Preparative Example 1 and 900 g of polypropylene were used without using the carbon black.

Comparative Example 7

The same as Example 1 was carried out while 100 g of the MWCNT surface-modified with oxygen of Preparative Example 2, instead of the MWCNT of Preparative Example 1, and 900 g of polypropylene were used without using the carbon black.

Comparative Example 8

The same as Example 4 was carried out, except that 70 g of the MWCNT surface-modified with oxygen of Preparative Example 2 was used instead of the MWCNT of Preparative Example 1.

Comparative Example 9

The same as Example 5 was carried out, except that 70 g of the MWCNT surface-modified with oxygen of Preparative Example 2 was used instead of the MWCNT of Preparative Example 1.

The use amounts, sheet resistances, EMI shielding effects, and I-zod impact strengths of materials used in respective examples and comparative examples are shown in Table 1 below.

Test Method

1. Measurement of Sheet Resistance

Measurement was carried out by using the Loresta GP (MCP-T600) by the MitsubishI Company according to JISK 7194/ASTM D991.

2. Measurement of EMI Shielding Effectiveness

Measurement was carried out by using the EMI system of Rhode & Schwartz Company according to ASTM D4935.

3. Measurement of I-Zod Impact Strength

Measurement was carried out by using an impact strength measurement device of Olsen Company according to ASTM D256.

TABLE 1

| Classification | CNT [g] | Kind of CNT Surface Modification Oxidant | Carbon Black [g] | Surface-Treated Carbon Black of Preparative Example 3 [g] | Carbon Fiber [g] | Aluminum Oxide ($Al_2O_3$) [g] | Polypropylene [g] | Sheet Resistance [Ω/□] | EMI Shielding Effectiveness [dB] | I-zod Impact Strength [kg·cm/cm] |
|---|---|---|---|---|---|---|---|---|---|---|
| Example 1 | 25 | Absence of Oxidant | 120 | — | — | — | 855 | 8.3 | 27.1 | 15.7 |
| Example 2 | 50 | Absence of Oxidant | 150 | — | — | — | 800 | 1.0 | 40.5 | 11.3 |
| Example 3 | 25 | Absence of Oxidant | — | — | 120 | — | 855 | 149.2 | 22.9 | 25.2 |
| Example 4 | 70 | Absence of Oxidant | 250 | — | — | — | 680 | 0.09 | 52.9 | 8.7 |
| Example 5 | 70 | Absence of Oxidant | — | — | — | 250 | 680 | 25 | 55.4 | 15.2 |
| Example 6 | 25 | Absence of Oxidant | — | 120 | — | — | 855 | 6.5 | 29.3 | 16.2 |
| Comparative Example 1 | 25 | Oxygen | 120 | — | — | — | 855 | 37.5 | 13.0 | 14.5 |
| Comparative Example 2 | 50 | Oxygen | 150 | — | — | — | 800 | 18.7 | 18.5 | 8.7 |
| Comparative Example 3 | 25 | Oxygen | — | — | 120 | — | 855 | 408.3 | 14.1 | 20.3 |
| Comparative Example 4 | — | — | 200 | — | — | — | 800 | 54.5 | 11.2 | 5.6 |
| Comparative Example 5 | — | — | — | — | 200 | — | 800 | 4219 | 13.1 | 31.2 |
| Comparative Example 6 | 100 | Absence of Oxidant | — | — | — | — | 900 | 6.3 | 28.4 | 17.3 |
| Comparative Example 7 | 100 | Oxygen | — | — | — | — | 900 | 12.0 | 21.5 | 14.8 |

TABLE 1-continued

| Classification | CNT [g] | Kind of CNT Surface Modification Oxidant | Carbon Black [g] | Surface-Treated Carbon Black of Preparative Example 3 [g] | Carbon Fiber [g] | Aluminum Oxide (Al$_2$O$_3$) [g] | Poly-propylene [g] | Sheet Resistance [Ω/□] | EMI Shielding Effectiveness [dB] | I-zod Impact Strength [kg · cm/cm] |
|---|---|---|---|---|---|---|---|---|---|---|
| Comparative Example 8 | 70 | Oxygen | 250 | — | — | — | 680 | 5.2 | 34.8 | 5.3 |
| Comparative Example 9 | 70 | Oxygen | — | — | — | 250 | 680 | 120 | 31.9 | 10.5 |

In Examples 1~5, the MWCNT surface-modified in a condition of the absence of oxidant was used and the parts by weight of the CNT and the carbon compound or metal oxide were changed. In Example 6, MWCNT and carbon black surface-modified in a condition of the absence of oxidant were all used. In Examples 1, 2, 3, 8, and 9, the MWCNT surface-modified in the oxygen addition condition was used and the parts by weight of the CNT and the carbon compound were changed. Comparative Examples 4 and 5 showed data about EMI shielding effectiveness of the carbon compound when the CNT was not added. In Comparative Examples 6 and 7, EMI shielding effectiveness was compared between the non-oxidant condition and the oxygen condition when only the MWCNT was added.

When compared with Examples 1 to 5 and Comparative Examples 1 to 3, 8, and 9, which are different in view of only the surface modification condition of MWCNT, Examples 1 to 5 using the MWCNT surface-modified in a condition of the absence of oxidant showed a lower sheet resistance, superior EMI shielding effectiveness, and superior I-zod impact strength, as compared with Comparative Examples 1 to 3, 8, and 9 using the MWCNT surface-modified in the oxygen oxidant condition. In addition, according to the results of Comparative Examples 4 and 5, it can be seen that desired sheet resistance, EMI shielding effectiveness, and I-zod impact strength could not be obtained without using the surface-modified CNT. In addition, Comparative Examples 6 and 7 showed differences in sheet resistance, EMI shielding effectiveness, and I-zod impact strength, depending on only surface modification condition of the CNT without using the carbon compound and metal compound. As the result, it can be confirmed that Comparative Example 6 using the CNT surface-modified in a condition of the absence of oxidant had a lower sheet resistance and higher EMI shielding effectiveness and I-zod impact strength as compared with Comparative Example 7 using the CNT surface-modified in the oxygen oxidant condition.

Therefore, it can be seen from the above results that, the resin composition for EMI shielding, comprising the resin, the carbon nanotube surface-modified in a condition of the absence of oxidant, and the carbon compound, metal, metal compound, or mixture thereof, of the present invention, has a low sheet resistance and thus high conductivity and superior impact relaxation, and an excellent EMI shielding effect.

INDUSTRIAL APPLICABILITY

As set forth above, the resin composition for EMI shielding, comprising a carbon hydride composite of the present invention employs the carbon nanotube surface-modified in a condition of the absence of oxidant; and the carbon compound, metal, metal compound, or a mixture thereof, as a composite material, and thus has excellent dispersibility and impact relaxation and high conductivity, and particularly has an EMI shielding effect.

In addition, the resin composition for EMI shielding of the present invention employs the carbon nanotube surface-modified in a condition of the absence of oxidant, and thus can facilitate surface modification in the environmentally friendly condition due to the exclusion of the use of acid and improve dispersibility with the resin.

The resin composition for EMI shielding, comprising a carbon hydride composite, according to the present invention, is specifically useful in an electronic control unit material for weight reduction of car, and thus can be replaced with a high-priced heavy metal material.

The invention claimed is:

1. A resin composition for electromagnetic interference (EMI) shielding, the resin composition comprising:
    (a) 100 parts by weight of a resin;
    based on 100 parts by weight of the resin,
    (b) 0.1 to 15 parts by weight of a carbon nanotube surface-modified in a condition of the absence of oxidant; and
    (c) 1 to 40 parts by weight of a carbon compound, metal, metal compound, or mixture thereof,
    wherein
        the carbon nanotube surface-modified in a condition of the absence of oxidant is obtained by surface-treating a conductive additive consisting of a carbon nanotube in a subcritical water or a supercritical water condition of a pressure of 50 to 400 atm and a temperature of 100 to 600° C., and
        at least the carbon compound is not surface-modified in a condition in the absence of oxidant.

2. The resin composition of claim 1, wherein the resin is one resin, a copolymer resin of two or more, or a mixture of two or more, selected from the group consisting of a polyacetal resin, an acryl based resin, a polycarbonate resin, a styrene based resin, a polyester resin, a vinyl based resin, a polyphenylene ether resin, a polyolefin resin, an acrylonitrile-butadiene-styrene copolymer resin, a polyarylate resin, a polyamide resin, a polyamideimide resin, a polyarylsulfone resin, a polyetherimide resin, a polyethersulfone resin, a polyphenylene sulfide resin, a fluorine based resin, a polyimide resin, a polyether ketone resin, a polybenzoxazole resin, a polyoxadiazol resin, a polybenzothiazole resin, a polybenzimidazole resin, a polypyridine resin, a polytriazole resin, a polypyrrolidone resin, a polydibenzofuran resin, a polysulfone resin, a polyurea resin, a polyphosphazene resin, a liquid crystal polymer resin, a silicon based resin, an epoxy resin, a phenol based resin, and a polyurethane resin.

3. The resin composition of claim 1, wherein the carbon nanotube is selected from the group consisting of a single-walled carbon nanotube, a double-walled carbon nanotube, a thin multi-walled carbon nanotube, a multi-walled carbon nanotube, a roped carbon nanotube, and a combination thereof.

4. The resin composition of claim 1, wherein the carbon compound is selected from the group consisting of carbon black, graphene, fullerene, graphite, graphite oxide, carbon fiber, and a mixture thereof.

5. The resin composition of claim 1, wherein the metal or metal compound is selected from the group consisting of copper, iron, nickel, aluminum, tin, zinc, silver, gold, nickel-copper alloy, alumina ($Al_2O_3$), alumina nitride (AlN), and oxides thereof.

6. The resin composition of claim 1, wherein the carbon compound, metal, or metal compound has an average particle size of 0.001~300 μm.

7. The resin composition of claim 1, wherein a weight ratio of the (b) carbon nanotube surface-modified in a condition of the absence of oxidant to the (c) carbon compound, metal, metal compound, or mixture thereof is 1:0.01 to 1:100.

8. A molded article manufactured by extruding, ejecting, or heat-molding the resin composition for EMI shielding of claim 1.

9. The molded article of claim 8, wherein the molded article is a plastic molded article capable of allowing thermal conductivity, electrostatic dispersion, or prevention of static electricity, by controlling an EMI shielding effect.

* * * * *